United States Patent
Kim et al.

(10) Patent No.: US 8,598,024 B2
(45) Date of Patent: Dec. 3, 2013

(54) FABRICATING METHOD OF METAL SILICIDE LAYER, FABRICATING METHOD OF SEMICONDUCTOR DEVICE USING THE SAME AND SEMICONDUCTOR DEVICE FABRICATED USING THE METHOD

(75) Inventors: Jin-Bum Kim, Seoul (KR); Chul-Sung Kim, Seongnam-si (KR); Sang-Woo Lee, Seoul (KR); Yu-Gyun Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 103 days.

(21) Appl. No.: 13/239,521

(22) Filed: Sep. 22, 2011

(65) Prior Publication Data

US 2012/0083089 A1    Apr. 5, 2012

(30) Foreign Application Priority Data

Oct. 1, 2010    (KR) .................. 10-2010-0095928

(51) Int. Cl.
*H01L 21/425*    (2006.01)

(52) U.S. Cl.
USPC .................. 438/528; 438/659; 257/E21.619

(58) Field of Classification Search
USPC .................. 438/407, 659, 663; 257/E21.339, 257/E21.343
See application file for complete search history.

(56) References Cited

U.S. PATENT DOCUMENTS

| | | | | |
|---|---|---|---|---|
| 6,072,222 A | * | 6/2000 | Nistler | 438/659 |
| 8,187,971 B2 | * | 5/2012 | Russell et al. | 438/659 |
| 2008/0020535 A1 | * | 1/2008 | Gulari et al. | 438/299 |

FOREIGN PATENT DOCUMENTS

| KR | 10-2000-0055922 A | 9/2000 |
|---|---|---|
| KR | 10-0329749 B1 | 3/2002 |
| KR | 10-2003-0044144 A | 6/2003 |

OTHER PUBLICATIONS

Kim, KR-10-2003-0044144 (published Jun. 9, 2003), English translation.*

* cited by examiner

*Primary Examiner* — Chandra Chaudhari
(74) *Attorney, Agent, or Firm* — Lee & Morse, P.C.

(57) ABSTRACT

A method of fabricating a metal silicide layer includes forming a metal layer on a substrate, and forming a pre-metal silicide layer by reacting the substrate with the metal layer by performing a first annealing process on the substrate. The method also includes implanting silicon into the substrate using a gas cluster ion beam (GCIB) process, and changing the pre-metal silicide layer into a metal silicide layer by performing a second annealing process on the substrate.

18 Claims, 8 Drawing Sheets

FABRICATING METHOD OF METAL SILICIDE LAYER, FABRICATING METHOD OF SEMICONDUCTOR DEVICE USING THE SAME AND SEMICONDUCTOR DEVICE FABRICATED USING THE METHOD

CROSS-REFERENCE TO RELATED APPLICATION

This application claims priority under 35 U.S.C. §119 from Korean Patent Application No. 10-2010-0095928, filed on Oct. 1, 2010, in the Korean Intellectual Property Office, and entitled: "Fabricating Method of Metal Silicide Layer, Fabricating Method of Semiconductor Device Using the Same and Semiconductor Device Fabricated Using the Method," which is incorporated by reference herein in its entirety.

BACKGROUND

Attempts are being made to improve operating characteristics of semiconductor devices. For example, attempts are being made to improve resistance within the semiconductor devices.

SUMMARY

Embodiments may be realized by providing a method of fabricating a metal silicide layer that includes forming a metal layer on a substrate, forming a pre-metal silicide layer by reacting the substrate with the metal layer by performing a first annealing process on the substrate, implanting silicon into the substrate using a gas cluster ion beam (GCIB) process, and changing the pre-metal silicide layer into a metal silicide layer by performing a second annealing process on the substrate.

An atomic ratio of a metal to silicon in the pre-metal silicide layer may be equal to or greater than 1, and an atomic ratio of a metal to silicon in the metal silicide layer may be less than 1.

Implanting silicon in the GCIB process may include using a silicon source gas. The silicon source gas may include at least one of silane (SiH4), disilane (Si2H6), dichlorosilane (DCS), trichlorosilane (TCS), and hexachlorodisilane (HCD). The GCIB process may include implanting at least one of carbon (C), fluorine ($F_2$), nitrogen ($N_2$), arsenic (As), boron (B), and phosphorus (P) into the substrate.

The second annealing process may be performed at a higher temperature than the first annealing process. Forming the metal layer may include using at least one of nickel (Ni), platinum (Pt), titanium (Ti), cobalt (Co), hafnium (Hf), and tungsten (W).

The method may include forming a first capping layer on the metal layer before performing the first annealing process, and forming a second capping layer on the pre-metal silicide layer before performing the second annealing process.

Embodiments may also be realized by providing a method of fabricating a semiconductor device that includes providing a substrate having a first region and a second region, forming a first gate and first source/drain regions in the first region and forming a second gate and second source/drain regions in the second region, forming first and second metal layers on the first and second source/drain regions, respectively, forming first and second pre-metal silicide layers on the first and second source/drain regions, respectively, by performing a first annealing process on the substrate, implanting silicon into the second region using a gas cluster ion beam (GCIB) process while blocking the first region, and changing the first and second pre-metal silicide layers into the first and second metal silicide layers, respectively, by performing a second annealing process on the substrate.

An atomic ratio of a metal to silicon in the first metal silicide layer may be greater than an atomic ratio of a metal to silicon in the second metal silicide layer. The atomic ratio of the metal to silicon in the first metal silicide layer may be equal to or greater than 1 and the atomic ratio of the metal to silicon in the second metal silicide layer may be less than 1. An atomic ratio of a metal to silicon in the second pre-metal silicide layer may be equal to or greater than 1 and the atomic ratio of the metal to silicon in the second metal silicide layer may be less than 1.

A silicon source gas may be used in the GCIB process. The silicon source gas including at least one of silane (SiH4), disilane (Si2H6), dichlorosilane (DCS), trichlorosilane (TCS), and hexachlorodisilane (HCD). The GCIB process may include implanting at least one of carbon (C), fluorine ($F_2$), nitrogen ($N_2$), arsenic (As), boron (B), and phosphorus (P) into the substrate. The second annealing process may be performed at a higher temperature than the first annealing process.

The method may include forming a first capping layer on the second metal layer before performing the first annealing process, and forming a second capping layer on the second pre-metal silicide layer before performing the second annealing process.

Embodiments may also be realized by providing a method of fabricating a metal silicide layer that includes forming a metal layer on a substrate, the substrate including silicon, reacting the metal layer with the silicon in the substrate to form a pre-metal silicide layer on the substrate, implanting additional silicon into the substrate using a gas cluster ion beam (GCIB) process after forming the pre-metal silicide layer, and reacting the substrate with the pre-metal silicide layer to form a metal silicide layer on the substrate after implanting the additional silicon into the substrate.

The metal silicide layer may have a lower metal to silicon ratio than a metal to silicon ratio of the pre-metal silicide layer. An atomic ratio of a metal to silicon in the pre-metal silicide layer may be equal to or greater than 1 and an atomic ratio of a metal to silicon in the metal silicide layer may be less than 1.

The method may include forming a first capping layer on the metal layer before forming the pre-metal silicide layer, forming a second capping layer on the pre-metal silicide layer after removing the first capping layer, and removing the second capping layer after forming the metal silicide layer. The method may include removing unreacted portions of the metal layer prior to implanting additional silicon into the substrate.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
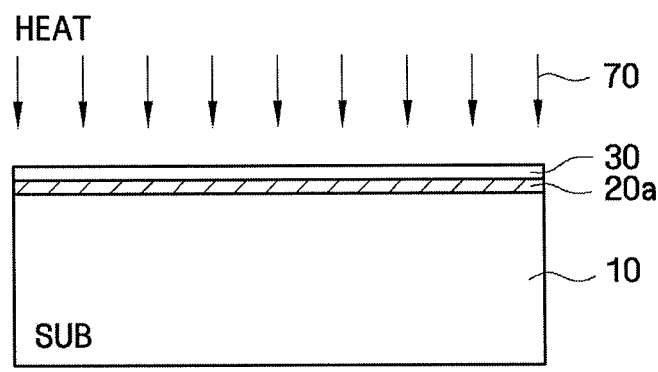
FIGS. 1 to 5 illustrate sectional views of stages in a fabricating method of a metal silicide layer, according to an exemplary embodiment.

Features of the embodiments and methods of accomplishing the same may be understood more readily by reference to the following detailed description of exemplary embodiments and the accompanying drawings. However, embodiments may be embodied in many different forms and should not be construed as being limited to the embodiments set forth herein. Rather, these exemplary embodiments are provided so that this disclosure will be thorough and complete, and will fully convey the concept of the invention to those skilled in the art. In the drawings, the thickness of layers and regions may be exaggerated for clarity.

It will be understood that when an element or layer is referred to as being "connected to" or "coupled to" another element or layer, it can be directly connected to or coupled to the other element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIGS. 1 to 5 illustrate sectional views of stages in a fabricating method of a metal silicide layer, according to an exemplary embodiment. Referring to FIG. 1, a metal layer 20a and a first capping layer 30 may be sequentially formed on a substrate 10. The metal layer 20a may be formed directly on the substrate 10 and the first capping layer 30 may be formed directly on the metal layer 20a.

According to an exemplary embodiment, the substrate 10 may be a silicon substrate, a silicon on insulator (SOI) substrate, a silicon germanium substrate, or the like.

The metal layer 20a may include, e.g., at least one of nickel (Ni), platinum (Pt), titanium (Ti), cobalt (Co), hafnium (Hf), and tungsten (W). In an exemplary embodiment, Ni may be used for the metal layer 20a. The metal layer 20a may be formed by a deposition process, e.g., physical vapor deposition (PVD), chemical vapor deposition (CVD), atomic layer deposition (ALD), or the like. A thickness of the metal layer 20a may be determined in consideration of, e.g., a thickness of silicon under the metal layer 20a. For example, the thickness of the metal layer 20a may be determined in consideration of the thickness of an underlying silicon substrate 10. The silicon under the metal layer 20a may be consumed during first and second thermal processes to be performed later. For example, although not shown, the first metal layer 20a may be formed to a thickness in which a junction region may not be completely consumed.

Figure 5:
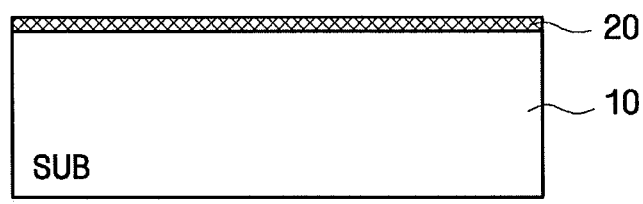

The first capping layer 30 may be formed on the metal layer 20a. The first capping layer 30 may be used, e.g., to improve the morphology of a metal silicide layer 20, e.g., as illustrated in FIG. 5. The first capping layer 30 may be coated to a thickness of, e.g., approximately 10 Å or greater, on the metal layer 20a. For example, the first capping layer 30 may include, e.g., at least one of titanium nitride (TiN), silicon-oxide-nitride (SiON), a silicon nitride (SiN), and silicon dioxide ($SiO_2$). However, embodiments are not limited thereto.

Next, a first annealing process 70 may be performed on the substrate 10. The first annealing process 70 may include reacting the substrate 10 with the metal layer 20a.

In the first annealing process 70, the substrate 10 may be heated at a temperature in a range of approximately 200° C. to approximately 300° C. for approximately 30 seconds. The first annealing process 70 may be a rapid thermal annealing (RTA) process.

Figure 2:
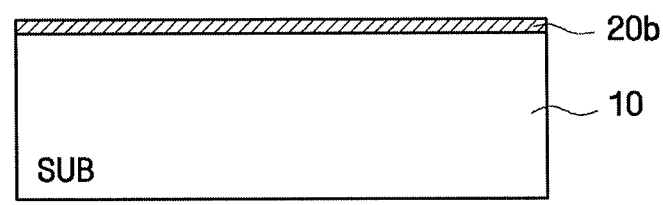

Through the first annealing process 70, a reaction may be carried out between the substrate 10 and the metal layer 20a to form a pre-metal silicide layer 20b, e.g., as illustrated in FIG. 2. In the pre-metal silicide layer 20b, an atomic ratio of a metal to silicon may be equal to or greater than 1. The atomic ratio of metal to silicon may refer to a number of metal atoms divided by a number of silicon atoms, e.g., to the following ratio: a number of total metal atoms/a number of total silicon atoms. The pre-metal silicide layer 20b may include more metal atoms than silicon atoms. For example, in a case of using Ni for a metal layer, the pre-metal silicide layer 20b may include nickel silicide $Ni_2Si$ or NiSi.

Referring to FIG. 2, after the first annealing process 70 is performed, the first capping layer 30 and an unreacted metal layer may be removed. The unreacted metal layer may be portions of the metal layer 20a that remained unreacted, e.g., did not react, with the silicon in the substrate 10 to form the pre-metal silicide layer 20b. The first capping layer 30 and the unreacted metal layer may be separately removed. Alternatively, the first capping layer 30 and the unreacted metal layer may be simultaneously removed.

Figure 3:
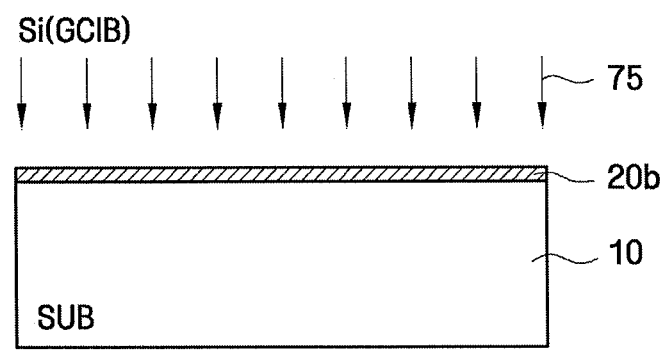

Referring to FIG. 3, silicon is implanted into the substrate 10. For example, the silicon may be implanted into the substrate 10 using a gas cluster ion beam (GCIB) process 75. The GCIB process 75 may be performed directly on the pre-metal silicide layer 20b or directly on a layer covering the pre-metal silicide layer 20b.

In the GCIB process 75, cluster gas, i.e., cluster-like gas, may be implanted into the substrate 10. The cluster gas may include a numerous number of molecules held together by, e.g., Van der Waals forces. The cluster gas may have a size distribution of, e.g., 500 $N/Q_{ave}$ to 50,000 $N/Q_{ave}$. Here, $N/Q_{ave}$ represents the number of atoms per charge. An average size of the cluster gases implanted into the substrate 10 may be, e.g., 10,000 $N/Q_{ave}$.

When silicon is implanted in the GCIB process 75, a silicon source gas may be used. According to an exemplary embodiment, the silicon source gas may include at least one of silane (SiH$_4$), disilane (Si$_2$H$_6$), dichlorosilane (DCS), trichlorosilane (TCS), and hexachlorodisilane (HCD).

Without intending to be bound by this theory, when the silicon implanted in the GCIB process 75 has a large molecular weight, an end of range (EOR) defect that may otherwise be generated in a general implantation process, e.g., a beam line implantation process, may not be not generated. For example, junction leakage type defects may not be generated in the resultant semiconductor device.

The silicon implanted into the substrate 10 during the GCIB process 75 may be in an amount sufficient to later form a silicon (Si)-rich metal silicide layer 20 on the substrate 10, e.g., as illustrated in of FIG. 5. For example, the amount of silicon implanted may exceed approximately $1 \times 10^{21}$ atoms/cm$^3$, more specifically approximately $5 \times 10^{22}$ atoms/cm$^3$; however, embodiments are not limited thereto.

In the GCIB process 75, a large amount of silicon may be implanted into the substrate 10 within a short time. Thus, the GCIB process 75 may increase a throughput, e.g., may increase the efficiency of the silicon implantation process.

In addition, the GCIB process 75 may facilitate shallow implantation of silicon into a surface of the substrate 10. Thus, an amount of probable leakage current in the resultant semiconductor device may not be noticeable.

If desired, at least one of carbon (C), fluorine (F$_2$), nitrogen (N$_2$), arsenic (As), boron (B), and phosphorus (P) may further be implanted into the substrate 10 using the GCIB process 75. The impurities may also be implanted shallowly into the surface of the substrate 10. Impurities such as C, F$_2$, N$_2$, As, B, or P may increase the thermal stability of the resultant silicon (Si)-rich metal silicide layer 20.

Figure 4:
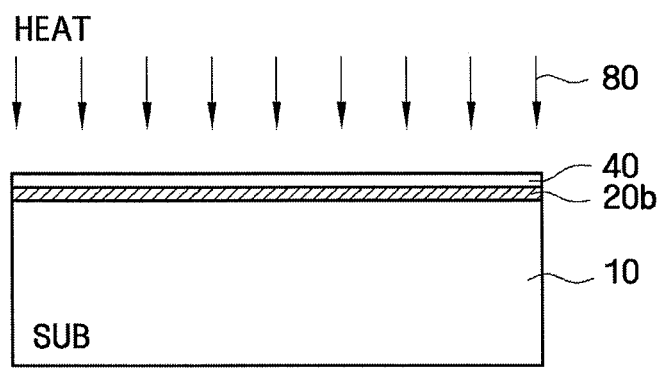

Referring to FIG. 4, prior to forming the final resultant silicon (Si)-rich metal silicide layer 20, a second capping layer 40 may be formed on the pre-metal silicide layer 20b. Thereafter, a second annealing process 80 may be performed.

The second capping layer 40 may be formed on the pre-metal silicide layer 20b so as to be used to, e.g., improve the morphology of the resultant silicon (Si)-rich metal silicide layer 20 illustrated in FIG. 5. The metal silicide layer 20 illustrated in FIG. 5 may be completed after the second annealing process 80. In particular, since two capping layers 30 and 40 may be used, the morphology of the metal silicide layer 20 may be greatly improved, e.g., compared to a case in which only one capping layer 30 is used. The second capping layer 40 may be coated to a thickness of, e.g., approximately 10 Å or greater. For example, similar to the first capping layer 30, the second capping layer 40 may include at least one of TiN, SiON, SiN and SiO$_2$. However, embodiments are not limited thereto.

Thereafter, the second annealing process 80 may be performed on the substrate 10. In the second annealing process 80, the pre-metal silicide layer 20b may be changed into the metal silicide layer 20 of FIG. 5. For example, according to an exemplary embodiment, if the pre-metal silicide layer 20b is made of and/or includes Ni$_2$Si or NiSi, the pre-metal silicide layer 20 formed may be made of and/or include NiSi$_2$. Here, an atomic ratio of a metal, e.g., Ni, to silicon in the metal silicide layer 20 may be smaller than 1.

The second annealing process 80 may be performed at a higher temperature than the first annealing process 70. In the second annealing process 80, the substrate 10 may be heated at a temperature in a range of, e.g., 400° C. to 700° C. The second annealing process 80 may be a rapid thermal annealing (RTA) process.

According to an exemplary embodiment, the temperature of the second annealing process 80 may not exceed 700° C. Silicon may already be implanted into a surface of the substrate 10 or the pre-metal silicide layer 20b. Thus, there may be a sufficient amount of silicon capable of forming a Si-rich silicide, e.g., forming NiSi$_2$. Therefore, the Si-rich silicide, e.g., NiSi$_2$, may be formed even if a metal, e.g., Ni, is not deeply diffused into the substrate 10. That is to say, the Si-rich silicide, e.g., NiSi$_2$, may be easily formed at a lower temperature, e.g., a temperature that does not exceed 700° C.

Referring to FIG. 5, the second capping layer 40 may be removed after the second annealing process 80. The second capping layer 40 may be removed using, e.g., sulfuric acid.

FIGS. 6 to 10 illustrate sectional views of stages in a fabricating method of a semiconductor device, according to an exemplary embodiment.

Figure 6:
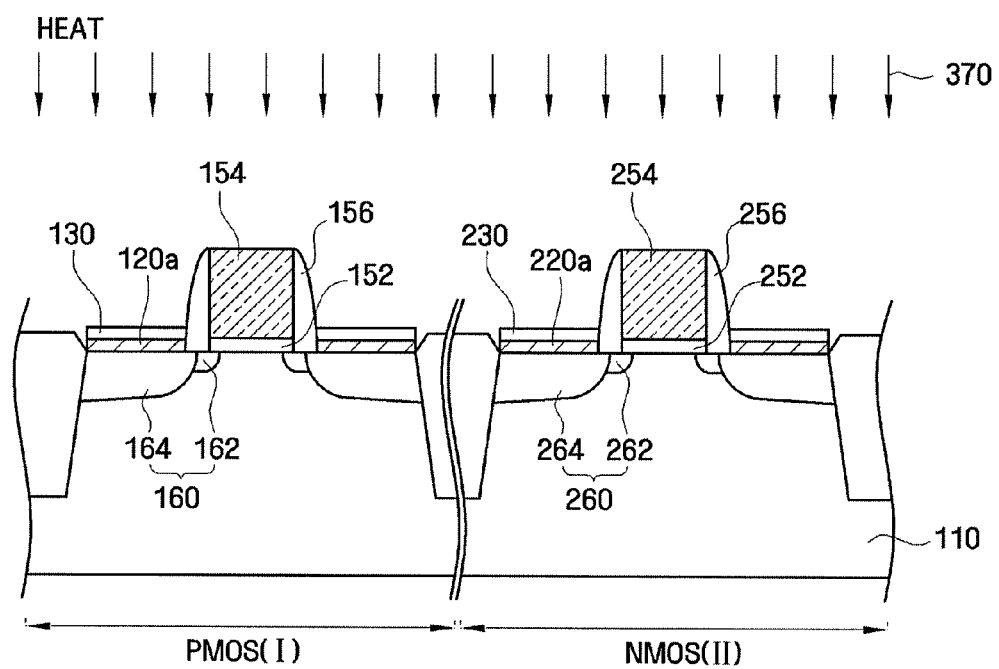
FIGS. 6 to 10 illustrate sectional views of stages in a fabricating method of a semiconductor device, according to an exemplary embodiment.

Referring to FIG. 6, a substrate 110 may include a first region I and a second region II. A PMOS transistor may be formed in the first region I. An NMOS transistor may be formed in the second region II.

A first gate 154, a first gate insulating layer 152, a first spacer 156, and a first source/drain region 160 may be formed in the first region I. A second gate 254, a second spacer 256, a second gate insulating layer 252, a second source/drain region 260 may be formed in the second region II. According to an exemplary embodiment, the first source/drain region 160 may include a first lightly diffused drain or first light doped drain (LDD) region 162 and a first heavily diffused drain or first heavily doped drain (HDD) region 164. The second source/drain region 260 may include a second LDD region 262 and a second HDD region 264. However, embodiments are not limited thereto, e.g., the arrangement of the LDD regions 162 and 262 relative to HDD regions 164 and 264 may be reversed.

Further, while the illustrated embodiment shows that the first source and drain region 160 and the second source and drain region 260 have a lightly diffused drain (LDD) structure, embodiments are not limited thereto. For example, the first source and drain region 160 and the second source and drain region 260 may have a double diffused drain (DDD) structure, a mask islanded double diffused drain (MIDDD) structure, a mask LDD (MLDD) structure, or a lateral double-diffused MOS (LDMOS) structure.

A first metal layer 120a and a second metal layer 220a may be formed on the first source/drain region 160 and the second source/drain region 260, respectively. The first metal layer 120a and second metal layer 220a may be formed after forming the first gate 154 and the second gate 154. However, embodiments are not limited thereto.

As described above, each of the first metal layer 120a and the second metal layer 220a may include at least one of Ni, Pt, Ti, Co, Hf, and W. In an exemplary embodiment, the first metal layer 120a and the second metal layer 220a are described with regard to a case of using Ni. The capping layers 130 and 230 may be formed on the first metal layer 120a and the second metal layer 220a, respectively.

A first annealing process 370 may be performed on the substrate 110 to react the substrate 110 with the first metal layer 120a and the second metal layer 220a. In the first annealing process 70, the substrate 10 may be heated at a temperature in a range of approximately 200° C. to approximately 300° C. for approximately 30 seconds. The first annealing process 370 may be a rapid thermal annealing (RTA) process. Through the first annealing process 370, reactions may be carried out between the substrate 110 and each of the first metal layer 120a and the second metal layer 220a to form first and second pre-metal silicide layers 120b and 220b, respectively. In each of the first and second pre-metal silicide layers 120b and 220b, an atomic ratio of a metal to silicon may be equal to or greater than 1.

Figure 7:
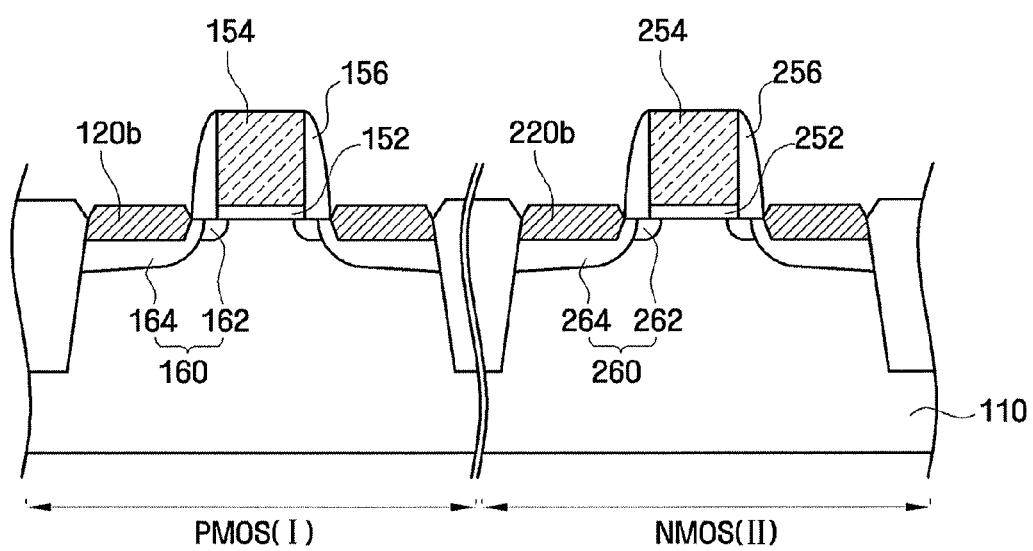

Referring to FIG. 7, the capping layers 130 and 230 and an unreacted metal layer may be removed.

Figure 8:
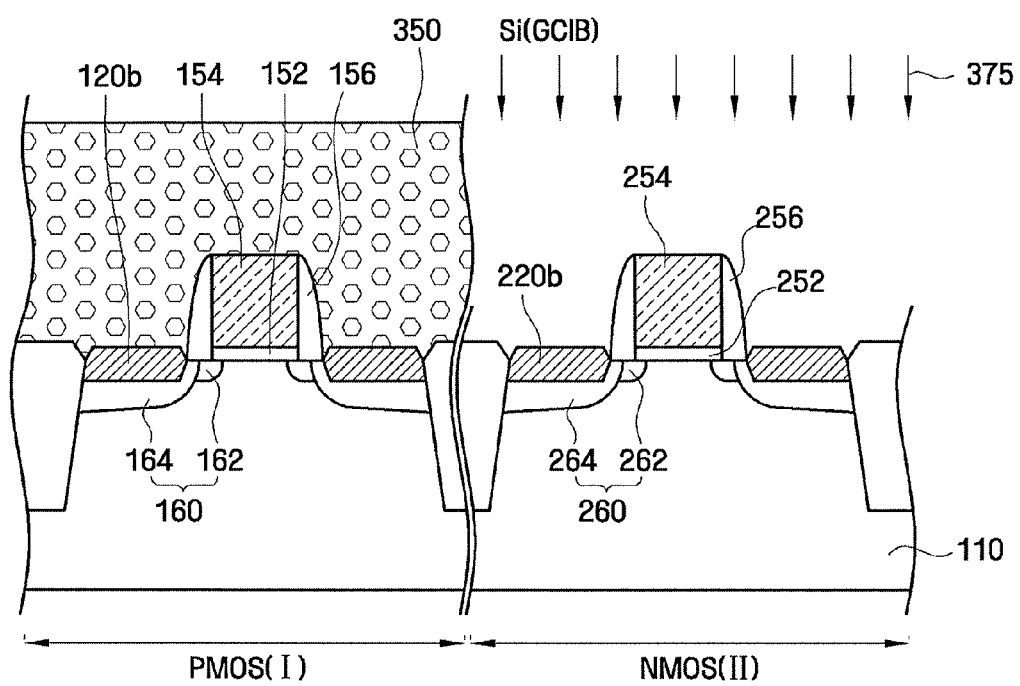

Referring to FIG. 8, silicon may be implanted into the second region II using, e.g., a gas cluster ion beam (GCIB) process 375. While performing the GCIB process 375 in the second region II, a mask 350 may be used to block, e.g., cover, the first region I. According to an exemplary embodiment, the GCIB process 375 may be performed on the second region II and may not be performed on the first region I. However, embodiments are not limited thereto.

When silicon is implanted in the GCIB process 375, a silicon source gas may be used. The silicon source gas may include at least one of $SiH_4$, $Si_2H_6$, dichlorosilane (DCS), trichlorosilane (TCS), and hexachlorodisilane (HCD). Further, according to an exemplary embodiment, at least one of C, $F_2$, $N_2$, As, B, and P may further be implanted into the substrate 110 using the GCIB process 375.

Figure 9:
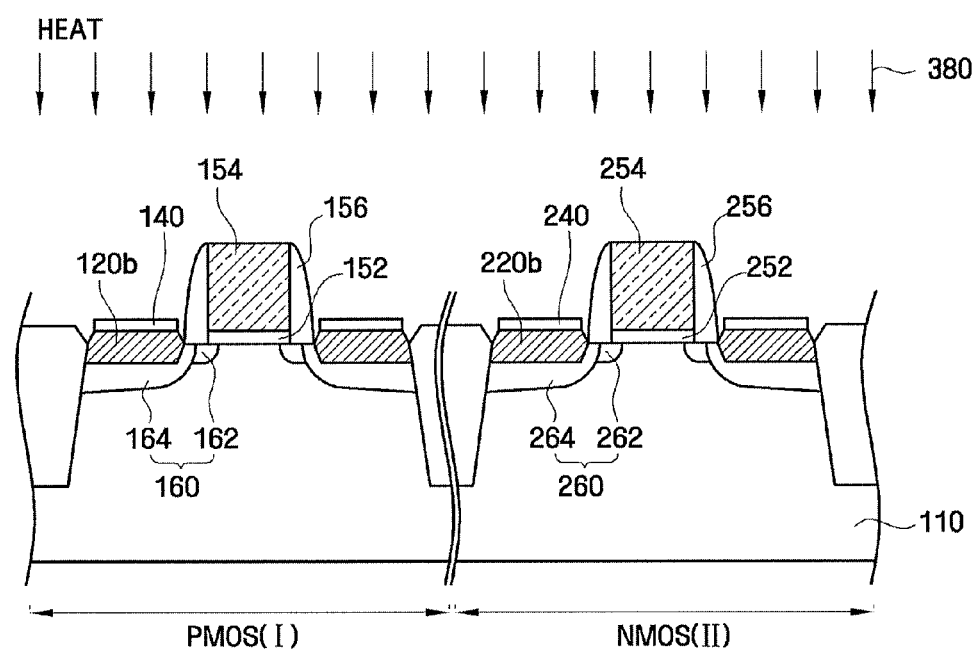

Referring to FIG. 9, capping layers 140 and 240 may be formed on the first and second pre-metal silicide layers 120b and 220b, respectively. Before forming the capping layers 140 in the first region I, the mask 350 may be removed from the first region I. Then, a second annealing process 380 may be performed on the substrate 110.

Figure 10:
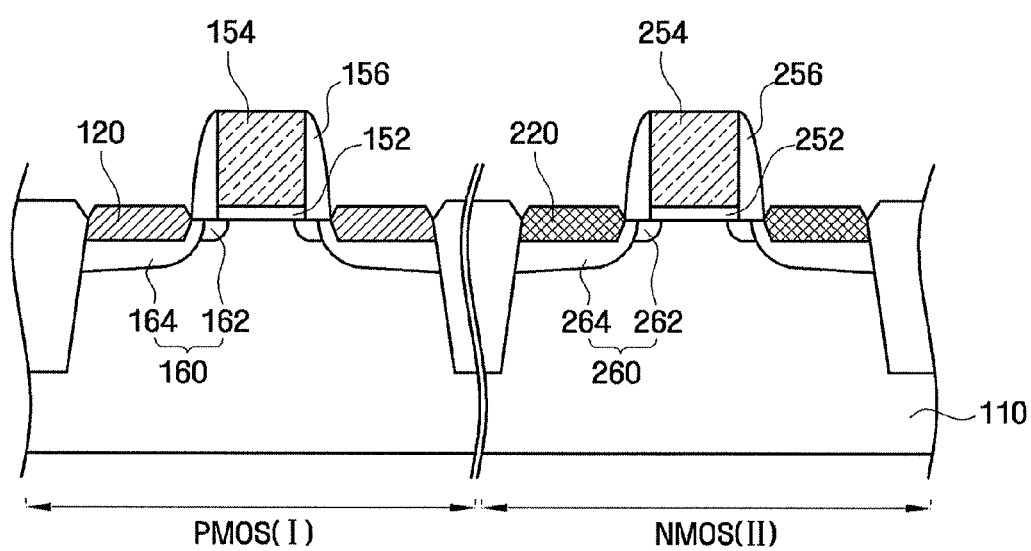

In the second annealing process 380, the first and second pre-metal silicide layers 120b and 220b may be changed into first and second metal silicide layers 120 and 220, respectively, e.g., as illustrated in FIG. 10.

The second annealing process 380 may be performed at a higher temperature than the first annealing process 370. In the second annealing process 380, the substrate 110 may be heated at a temperature in a range of, e.g., 400° C. to 700° C. The annealing temperature range may be adjusted according to the semiconductor device being fabricated.

According to an exemplary embodiment, in the first and second silicide layers 120 and 220, a metal to silicon atomic ratio of the first metal silicide layer 120 may be greater than that of the second metal silicide layer 220. For example, the first metal silicide layer 120 may include $Ni_2Si$ or NiSi, and the second metal silicide layer 220 may include $NiSi_2$.

As described above, according to an exemplary embodiment, silicon may be implanted into the second region II but not implanted into the first region I. Thus, at a temperature not exceeding 700° C. (which may be a temperature where a metal such as Ni cannot move deeply into the substrate 110 to cause a reaction) the first pre-metal silicide layer 120b may not be about to be changed into a Si-rich silicide layer and the second pre-metal silicide layer 220b may be changed into a Si-rich silicide layer.

Without intending to be bound by this theory, a work function of a silicide layer may affect the operation of an MOS transistor. Specifically, a work function of a Si-rich silicide layer may advantageously affect an operation of an NMOS transistor while disadvantageously affecting an operation of a PMOS transistor. Therefore, according to an exemplary embodiment, since silicon is implanted into only the second region II, a metal-to-silicon atomic ratio of the first metal silicide layer 120 formed in the first region I may be greater than that of the second metal silicide layer 220 formed in the second region II.

Referring to FIG. 10, the capping layers 140 and 240 formed on the first and second pre-metal silicide layers 120b and 220b may be removed. Thereafter, the exemplary stages of a method of manufacturing semiconductor devices according to an exemplary embodiment may be completed.

The semiconductor device, according to an exemplary embodiment, may include the substrate 110 having the first region I and the second region II defined therein. The first transistor formed in the first region I may include the first gate 154, the first source and drain region 160, and the first metal silicide layer 120 formed on the first source and drain region 160. The second transistor formed in the second region II may include the second gate 254, the second source/drain region 260, and the second metal silicide layer 220 formed on the second source/drain region 260. A metal-to-silicon atomic ratio of the first metal silicide layer 120 may be greater than that of the second metal silicide layer 220.

Figure 11:
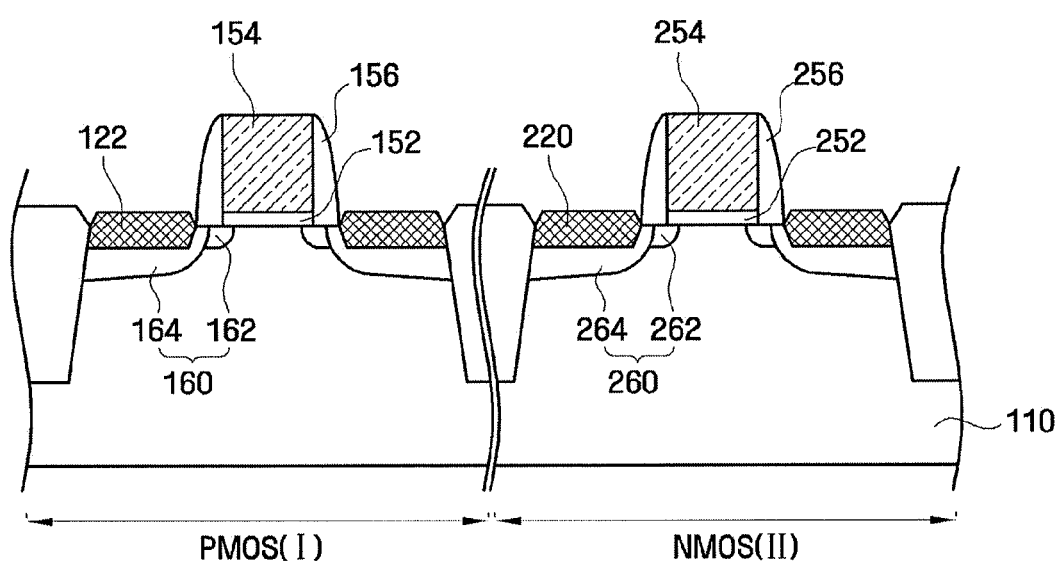
FIG. 11 illustrates a sectional view of a fabricated semiconductor device fabricated, according to an exemplary embodiment.

FIG. 11 illustrates a sectional view of a semiconductor device fabricated according to another exemplary embodiment. Referring to FIG. 11, in the semiconductor device according to an exemplary embodiment, a metal-to-silicon atomic ratio of a first metal silicide layer 122 may be substantially equal to that of a second metal silicide layer 220. For example, a gas cluster ion beam (GCIB) process may be performed on both the first region I and the second region II of the substrate 110 such that the first metal silicide layer 122 and the second metal silicide layer 220 may have substantially equal metal-to-silicon atomic ratios. A semiconductor device in which a work function of the first metal silicide layer 120 does not affect the operation of a PMOS transistor, may be fabricated according to this exemplary embodiment.

The fabricating method of the semiconductor device according to an exemplary embodiment may be substantially the same as that according to the previous embodiment, except for the process shown in FIG. 8. That is to say, unlike in FIG. 8, silicon is implanted into both a first region I and a second region II using a GCIB process. Accordingly, after performing a second annealing process, Si-rich silicide layers may be formed in both the first region I and the second region II.

By way of summation and review, attempts to improve resistance include improving contact resistance between silicide and a silicon substrate. One of the important features of the contact resistance between the silicide and the silicon substrate include a work function of silicide and a doping concentration of a silicon substrate. In this regard, a Schottky barrier height (SBH) may be determined by the work function and the doping concentration, and the contact resistance may be determined by the SBH.

Embodiments, e.g., the exemplary embodiments discussed above, relate to a fabricating method of a metal silicide layer that may have improved operating characteristics. Embodiments also relate to a fabricating method of a semiconductor device that may have improved operating characteristics. Embodiments may also relate to a semiconductor device having improved operating characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a metal silicide layer, the method comprising:

forming a metal layer on a substrate;

forming a first capping layer on the metal layer before performing a first annealing process;

forming a pre-metal silicide layer by reacting the substrate with the metal layer by performing the first annealing process on the substrate;

implanting silicon into the substrate using a gas cluster ion beam (GCIB) process;

forming a second capping layer on the pre-metal silicide layer after the first annealing process and before performing a second annealing process; and changing the pre-metal silicide layer into a metal silicide layer by performing the second annealing process on the substrate.

2. The method as claimed in claim 1, wherein an atomic ratio of a metal to silicon in the pre-metal silicide layer is equal to or greater than 1, and an atomic ratio of a metal to silicon in the metal silicide layer is less than 1.

3. The method as claimed in claim 1, wherein implanting silicon in the GCIB process includes using a silicon source gas, the silicon source gas including at least one of silane ($SiH_4$), disilane ($Si_2H_6$), dichlorosilane (DCS), trichlorosilane (TCS), and hexachlorodisilane (HCD).

4. The method as claimed in claim 3, wherein the GCIB process includes implanting at least one of carbon (C), fluorine ($F_2$), nitrogen ($N_2$), arsenic (As), boron (B), and phosphorus (P) into the substrate.

5. The method as claimed in claim 1, wherein the second annealing process is performed at a higher temperature than the first annealing process.

6. The method as claimed in claim 1, wherein forming the metal layer includes using at least one of nickel (Ni), platinum (Pt), titanium (Ti), cobalt (Co), hafnium (Hf), and tungsten (W).

7. A method of fabricating a semiconductor device, the method comprising:

providing a substrate having a first region and a second region;

forming a first gate and first source/drain regions in the first region and forming a second gate and second source/drain regions in the second region;

forming first and second metal layers on the first and second source/drain regions, respectively;

forming a first capping layer on the second metal layer before performing a first annealing process;

forming first and second pre-metal silicide layers on the first and second source/drain regions, respectively, by performing the first annealing process on the substrate;

implanting silicon into the second region using a gas cluster ion beam (GCIB) process while blocking the first region;

forming a second capping layer on the second pre-metal silicide layer before performing a second annealing process; and changing the first and second pre-metal silicide layers into the first and second metal silicide layers, respectively, by performing the second annealing process on the substrate.

8. The method as claimed in claim 7, wherein an atomic ratio of a metal to silicon in the first metal silicide layer is greater than an atomic ratio of a metal to silicon in the second metal silicide layer.

9. The method as claimed in claim 8, wherein the atomic ratio of the metal to silicon in the first metal silicide layer is equal to or greater than 1 and the atomic ratio of the metal to silicon in the second metal silicide layer is less than 1.

10. The method as claimed in claim 7, wherein an atomic ratio of a metal to silicon in the second pre-metal silicide layer is equal to or greater than 1 and the atomic ratio of the metal to silicon in the second metal silicide layer is less than 1.

11. The method as claimed in claim 7, wherein a silicon source gas is used in the GCIB process, the silicon source gas including at least one of silane ($SiH_4$), disilane ($Si_2H_6$), dichlorosilane (DCS), trichlorosilane (TCS), and hexachlorodisilane (HCD).

12. The fabricating method as claimed in claim 11, wherein the GCIB process further includes implanting at least one of carbon (C), fluorine ($F_2$), nitrogen ($N_2$), arsenic (As), boron (B), and phosphorus (P) into the substrate.

13. The method as claimed in claim 7, wherein the second annealing process is performed at a higher temperature than the first annealing process.

14. A method of fabricating a metal silicide layer, the method comprising:

forming a metal layer on a substrate, the substrate including silicon;

reacting the metal layer with the silicon in the substrate to form a pre-metal silicide layer on the substrate;

implanting additional silicon into the substrate using a gas cluster ion beam (GCIB) process after forming the pre-metal silicide layer; and reacting the substrate with the pre-metal silicide layer to form a metal silicide layer on the substrate after implanting the additional silicon into the substrate, wherein the method further comprises:

forming a first capping layer on the metal layer before forming the pre-metal silicide layer, and forming a second capping layer on the pre-metal silicide layer after removing the first capping layer.

15. The method as claimed in claim 14, wherein the metal silicide layer has a lower metal to silicon ratio than a metal to silicon ratio of the pre-metal silicide layer.

16. The method as claimed in claim 14, wherein an atomic ratio of a metal to silicon in the pre-metal silicide layer is equal to or greater than 1 and an atomic ratio of a metal to silicon in the metal silicide layer is less than 1.

17. The method as claimed in claim 14, further comprising:

removing the first capping layer before forming a second capping layer; and removing the second capping layer after forming the metal silicide layer.

18. The method as claimed in claim 14, further comprising removing unreacted portions of the metal layer prior to implanting additional silicon into the substrate.

* * * * *